(12) United States Patent
Suzuki

(10) Patent No.: US 11,574,672 B2
(45) Date of Patent: Feb. 7, 2023

(54) SEMICONDUCTOR DEVICE INCLUDING VOLTAGE MONITORING CIRCUIT FOR MONITORING A VOLTAGE STATE OF THE SEMICONDUCTOR DEVICE

(71) Applicant: Kioxia Corporation, Tokyo (JP)

(72) Inventor: Yoshinao Suzuki, Yokohama Kanagawa (JP)

(73) Assignee: KIOXIA CORPORATION, Tokyo (JP)

(\*) Notice: Subject to any disclaimer, the term of this patent is extended or adjusted under 35 U.S.C. 154(b) by 59 days.

(21) Appl. No.: 17/184,123

(22) Filed: Feb. 24, 2021

(65) Prior Publication Data

US 2022/0076734 A1 Mar. 10, 2022

(30) Foreign Application Priority Data

Sep. 4, 2020 (JP) .............................. JP2020-148965

(51) Int. Cl.
*G11C 11/4093* (2006.01)
*G11C 5/06* (2006.01)
*G11C 11/408* (2006.01)
*G11C 11/4074* (2006.01)

(52) U.S. Cl.
CPC ............ *G11C 11/4093* (2013.01); *G11C 5/06* (2013.01); *G11C 11/4074* (2013.01); *G11C 11/4085* (2013.01)

(58) Field of Classification Search
CPC ............ G11C 11/4093; G11C 11/4074; G11C 11/4085; G11C 5/06
USPC ..................................................... 365/189.05
See application file for complete search history.

(56) References Cited

U.S. PATENT DOCUMENTS

| 7,378,896 | B2 * | 5/2008 | Wong ................. | H03K 19/1732 |
| | | | | 327/143 |
| 9,953,714 | B2 | 4/2018 | Yanagidaira | |
| 2013/0193944 | A1 * | 8/2013 | Suzuki ................... | G11C 5/145 |
| | | | | 323/298 |
| 2019/0080745 | A1 * | 3/2019 | Kim ..................... | G11C 11/4093 |
| 2021/0050049 | A1 * | 2/2021 | Baek .................... | G11C 11/4093 |

FOREIGN PATENT DOCUMENTS

JP 2017-224978 A 12/2017

\* cited by examiner

*Primary Examiner* — Connie C Yoha
(74) *Attorney, Agent, or Firm* — Foley & Lardner LLP

(57) ABSTRACT

A semiconductor device includes a first pad, a comparison circuit, and a control circuit. A first voltage may be applicable to the first pad. The comparison circuit may include a first input terminal connected to the first pad, a second input terminal to which a second voltage is applicable, and an output terminal configured to output a comparison result between the first voltage and the second voltage. The control circuit may be configured to output, external to the semiconductor device, a signal based on the comparison result.

19 Claims, 11 Drawing Sheets

US 11,574,672 B2

SEMICONDUCTOR DEVICE INCLUDING VOLTAGE MONITORING CIRCUIT FOR MONITORING A VOLTAGE STATE OF THE SEMICONDUCTOR DEVICE

CROSS-REFERENCE TO RELATED APPLICATION

This application is based upon and claims the benefit of priority from Japanese Patent Application No. 2020-148965, filed Sep. 4, 2020, the entire contents of which are incorporated herein by reference.

FIELD

Embodiments described herein relate generally to a semiconductor device.

BACKGROUND

A NAND flash memory is known as a semiconductor device.

DETAILED DESCRIPTION

Figure 1:
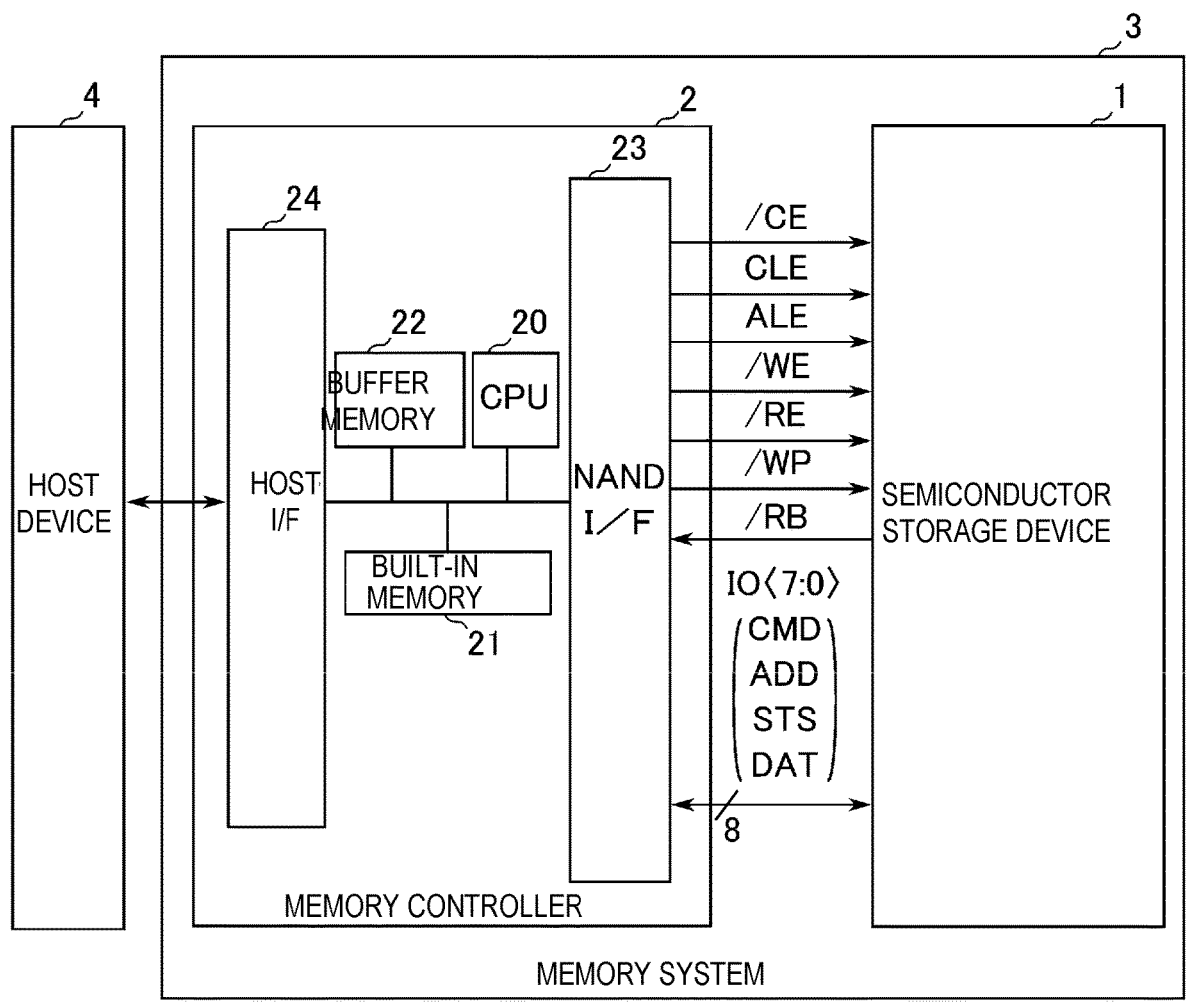
FIG. 1 is a block diagram showing an example of a configuration of a memory system including a semiconductor storage device according to a first embodiment.

Embodiments provide a semiconductor device with improved reliability.

In general, according to one embodiment, a semiconductor device may include a first pad to which a first voltage is applied from outside, a comparison circuit, and a control circuit. The comparison circuit may include a first input terminal connected to the first pad, a second input terminal to which a second voltage is applied, and an output terminal configured to output a comparison result between the first voltage and the second voltage. The control circuit may be configured to output, to the outside, a signal based on the comparison result.

Hereinafter, embodiments will be described with reference to the drawings. In the following description, components having the same function and configuration are denoted by the same reference numerals.

1. First Embodiment

Hereinafter, a semiconductor device according to a first embodiment will be described. Hereinafter, a NAND flash memory will be described as an example of the semiconductor device.

1.1 Configuration

A configuration of the semiconductor storage device according to the first embodiment will be described.

1.1.1 Overall Configuration of Memory System

First, an example of a configuration of a memory system will be described with reference to FIG. 1. FIG. 1 is a block diagram showing an example of a configuration of a memory system including the semiconductor storage device according to the first embodiment.

A memory system 3 may communicate with, for example, an external host device 4. The memory system 3 may store data from the host device 4 and reads data to the host device 4. The memory system 3 is, for example, a solid state drive (SSD) or an SD™ card.

The memory system 3 may include a semiconductor storage device 1 and a memory controller 2.

The semiconductor storage device 1 may include a plurality of memory cell transistors and stores data in a non-volatile manner. The semiconductor storage device 1 may be connected to the memory controller 2 via a NAND bus.

The NAND bus may transmit and receive signals/CE, CLE, ALE, /WE, /RE, /WP, /RB, and IO<7:0> via separate signal lines according to a NAND interface. The signal/CE may be a signal for enabling the semiconductor storage device 1. The signal CLE may notify the semiconductor storage device 1 that the signal IO<7:0> flowing into the semiconductor storage device 1 is a command when the signal CLE is at a "H (High)" level. The signal ALE may notify the semiconductor storage device 1 that the signal IO<7:0> flowing into the semiconductor storage device 1 is an address when the signal ALE is at a "H" level. The signal/WE may instruct the semiconductor storage device 1 to take in the signal IO<7:0> flowing into the semiconductor storage device 1 when the signal/WE is at a "L (Low)" level. The signal/RE may instruct the semiconductor storage device 1 to output the signal IO<7:0>. The signal/WP may instruct the semiconductor storage device 1 to prohibit data write and erase. The signal/RB may indicate whether the semiconductor storage device 1 is in a ready state (a state of receiving a command from outside) or a busy state (a state of not receiving a command from outside). The signal IO<7:0> is, for example, an 8-bit signal.

The signal IO<7:0> may be transmitted and received between the semiconductor storage device 1 and the memory controller 2, and include a command CMD, an address ADD, a status STS, and data DAT. The data DAT includes write data and read data.

The memory controller 2 may receive a command from the host device 4 and control the semiconductor storage device 1 based on the received command. Specifically, the memory controller 2 may write, into the semiconductor storage device 1, data instructed to be written from the host device 4, and read, from the semiconductor storage device 1, data instructed to be read from the host device 4 to transmit the read data to the host device 4.

Examples of the host device 4 that uses the memory system 3 described above include a digital camera and a personal computer.

1.1.2 Configuration of Memory Controller

As shown in FIG. 1, the memory controller 2 includes a central processing unit (CPU) 20, a built-in memory 21, a buffer memory 22, a NAND interface circuit (NAND I/F) 23, and a host interface circuit (host I/F) 24. The memory controller 2 is implemented by, for example, a System-on-a-Chip (SoC).

The CPU 20 may control overall operations of the memory controller 2. For example, in response to a data read command received from the host device 4, the CPU 20 issues, to the semiconductor storage device 1, a command read based on the NAND interface. This operation is the same in a case of data write and erase. The CPU 20 may have a function of executing various calculations on data read from the semiconductor storage device 1.

The built-in memory 21 is, for example, a semiconductor memory such as a dynamic random access memory (DRAM), and is used as a work area of the CPU 20. The built-in memory 21 may store firmware, various management tables, and the like for managing the semiconductor storage device 1.

The buffer memory 22 may temporarily store read data received by the memory controller 2 from the semiconductor storage device 1, write data received by the memory controller 2 from the host device 4, and the like.

The NAND interface circuit 23 may be connected to the semiconductor storage device 1 via a NAND bus and controls communication between the memory controller 2 and the semiconductor storage device 1. The NAND interface circuit 23 may transmit a command CMD, an address ADD, and write data to the semiconductor storage device 1 according to an instruction from the CPU 20. The NAND interface circuit 23 may receive read data and a status STS from the semiconductor storage device 1.

The host interface circuit 24 may be connected to the host device 4 via a host bus, and control communication between the memory controller 2 and the host device 4. The host interface circuit 24 separately transfers, for example, a command and data received from the host device 4 to the CPU 20 and the buffer memory 22.

1.1.3 Configuration of Semiconductor Storage Device

Figure 2:
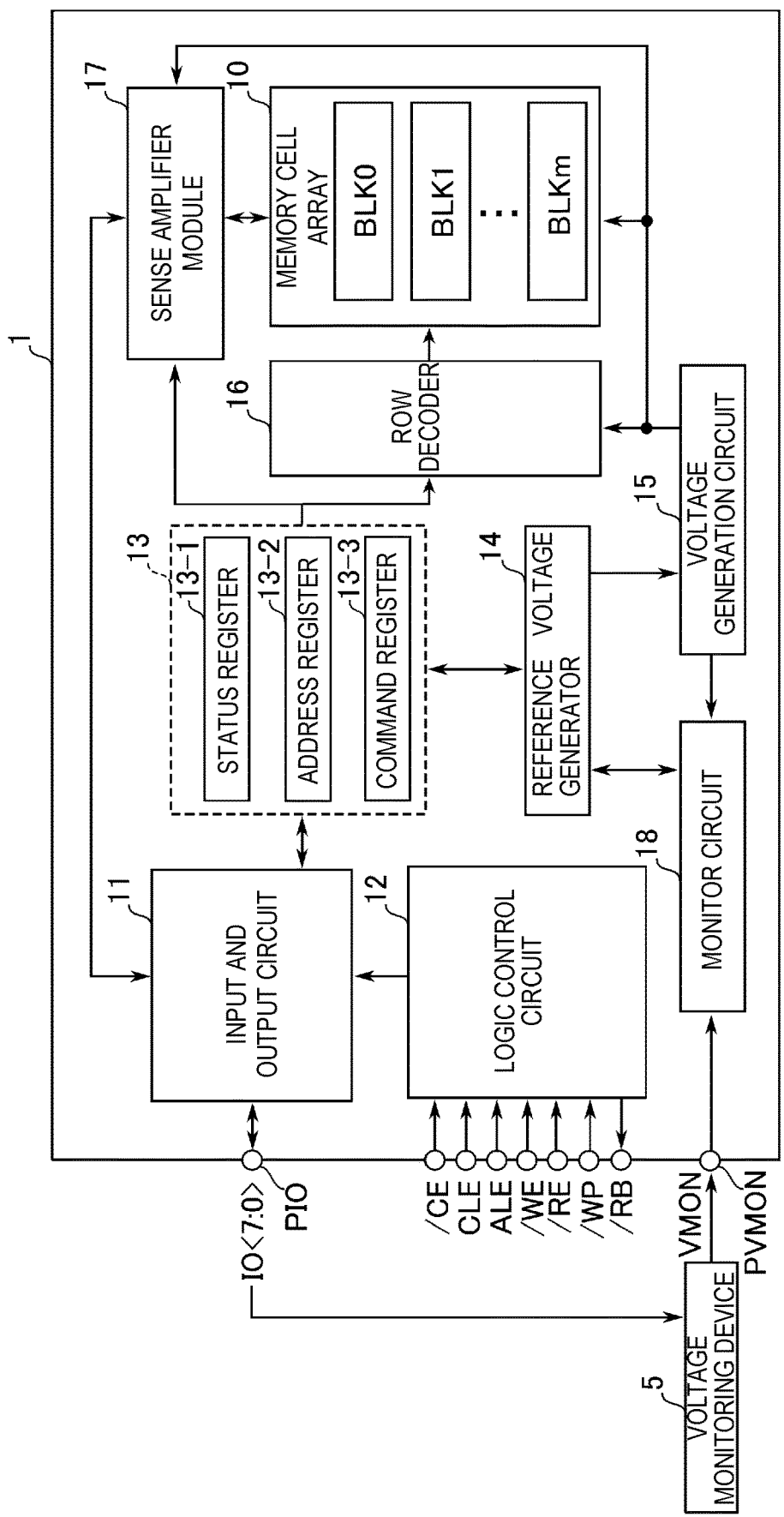
FIG. 2 is a block diagram showing an example of a configuration of the semiconductor storage device according to the first embodiment.

Next, an example of a configuration of the semiconductor storage device according to the first embodiment will be described with reference to FIG. 2. FIG. 2 is a block diagram showing an example of a configuration of the semiconductor storage device 1 according to the first embodiment.

The semiconductor storage device 1 can be connected to an external voltage monitoring device 5 via a pad PVMON, PIO, and the like. The voltage monitoring device 5 is, for example, an oscilloscope, and has a function of determining a voltage value of a monitor target node in an internal circuit of the semiconductor storage device 1 by executing a voltage monitoring operation together with the semiconductor storage device 1. Specifically, in the voltage monitoring operation, for example, the voltage monitoring device 5 supplies a reference voltage VMON to the pad PVMON, and receives a status STS corresponding to the reference voltage VMON from the pad PIO. Then, the voltage monitoring device 5 may determine a voltage value of the monitor target node based on the status STS. Details of the voltage monitoring operation will be described later.

Although the voltage monitoring device 5 is directly connected to the semiconductor storage device 1 in the example in FIG. 2, the present disclosure is not limited thereto. For example, the voltage monitoring device 5 may be connected to the semiconductor storage device 1 via the memory controller 2, and may execute the voltage monitoring operation together with the semiconductor storage device 1 under the control of the memory controller 2.

The semiconductor storage device 1 may include a memory cell array 10, an input and output circuit 11, a logic control circuit 12, a register 13, a reference voltage generator 14, a voltage generation circuit 15, a row decoder 16, a sense amplifier module 17, and a monitor circuit 18. The register 13 may include a status register 13-1, an address register 13-2, and a command register 13-3.

The memory cell array 10 may include a plurality of blocks BLK0 to BLKm (m is an integer of 1 or more). Each block BLK may be a set of a plurality of memory cell transistors capable of storing data in a nonvolatile manner, and is used as, for example, a data erase unit. That is, data stored in memory cell transistors provided in the same block BLK is collectively erased. A plurality of bit lines and a plurality of word lines may be provided in the memory cell array 10. Each memory cell transistor may be associated with one bit line and one word line. A detailed configuration of the memory cell array 10 will be described later.

The input and output circuit 11 may transmit the signal IO<7:0> to the memory controller 2 and receive the signal IO<7:0> from the memory controller 2. The input and output circuit 11 may output the status STS stored in the status register 13-1 to the outside of the semiconductor storage device 1. For example, the input and output circuit 11 transmits the status STS generated in the voltage monitoring operation to the voltage monitoring device 5. The input and output circuit 11 may respectively transfer an address ADD and a command CMD in the signal IO<7:0> to the address register 13-2 and the command register 13-3. The input and output circuit 11 may transmit data DAT to the sense amplifier module 17 and receive data DAT from the sense amplifier module 17.

The logic control circuit 12 receives, for example, signals/CE, CLE, ALE, /WE, /RE, and /WP from the memory controller 2, and may control the input and output circuit 11 based on the received signals. The logic control circuit 12 may generate a signal /RB and transmits the signal /RB to the memory controller 2.

The register 13 may store various signals. The status register 13-1 may store a status STS transferred from the reference voltage generator 14. The status register 13-1 may transfer the status STS to the input and output circuit 11 based on an instruction from the reference voltage generator 14. The address register 13-2 and the command register 13-3 may respectively store an address ADD and a command CMD that are transferred from the input and output circuit 11. The address register 13-2 may transfer the address ADD to the row decoder 16 and the sense amplifier module 17, and the command register 13-3 may transfer the command CMD to the reference voltage generator 14.

The reference voltage generator 14 may receive the command CMD from the command register 13-3, and control the entire semiconductor storage device 1 according to a sequence based on the received command CMD. For example, when receiving a command to execute a voltage monitoring operation, the reference voltage generator 14 receives a status STS from the monitor circuit 18 and transfers the received status STS to the status register 13-1.

The voltage generation circuit 15 may generate a voltage to be used in a write operation, a read operation, or the like based on an instruction from the reference voltage generator 14, and may supply the generated voltage to the memory cell array 10, the row decoder 16, the sense amplifier module 17, or the like. In addition, the voltage generation circuit 15 may generate a voltage to be used in a voltage monitoring operation based on an instruction from the reference voltage generator 14, and supply the voltage to the monitor circuit 18.

The row decoder 16 may receive a block address in the address ADD from the address register 13-2, and select one of the blocks BLK0 to BLKm based on the block address. The row decoder 16 may select a row direction corresponding to a plurality of word lines in the selected block BLK, and may apply a voltage supplied from the voltage generation circuit 15 to the selected word line.

During data read, the sense amplifier module 17 may sense a threshold voltage of a memory cell transistor to be read in the memory cell array 10 to generate read data, and transfer the generated read data to the input and output circuit 11. During data write, the sense amplifier module 17 may receive write data from the input and output circuit 11 and transfer the received write data to the memory cell array 10.

The monitor circuit 18 may be provided between a monitor target node and the pad PVMON. The monitor target node may include a high voltage and high/low impedance node provided in the voltage generation circuit 15 or the like. During the voltage monitoring operation, the monitor circuit 18 as a comparison circuit may compare a voltage of the monitor target node with the reference voltage VMON applied from the voltage monitoring device 5 to the pad PVMON, and transfer a comparison result to the reference voltage generator 14.

1.1.4 Configuration of Memory Cell Array

Figure 3:
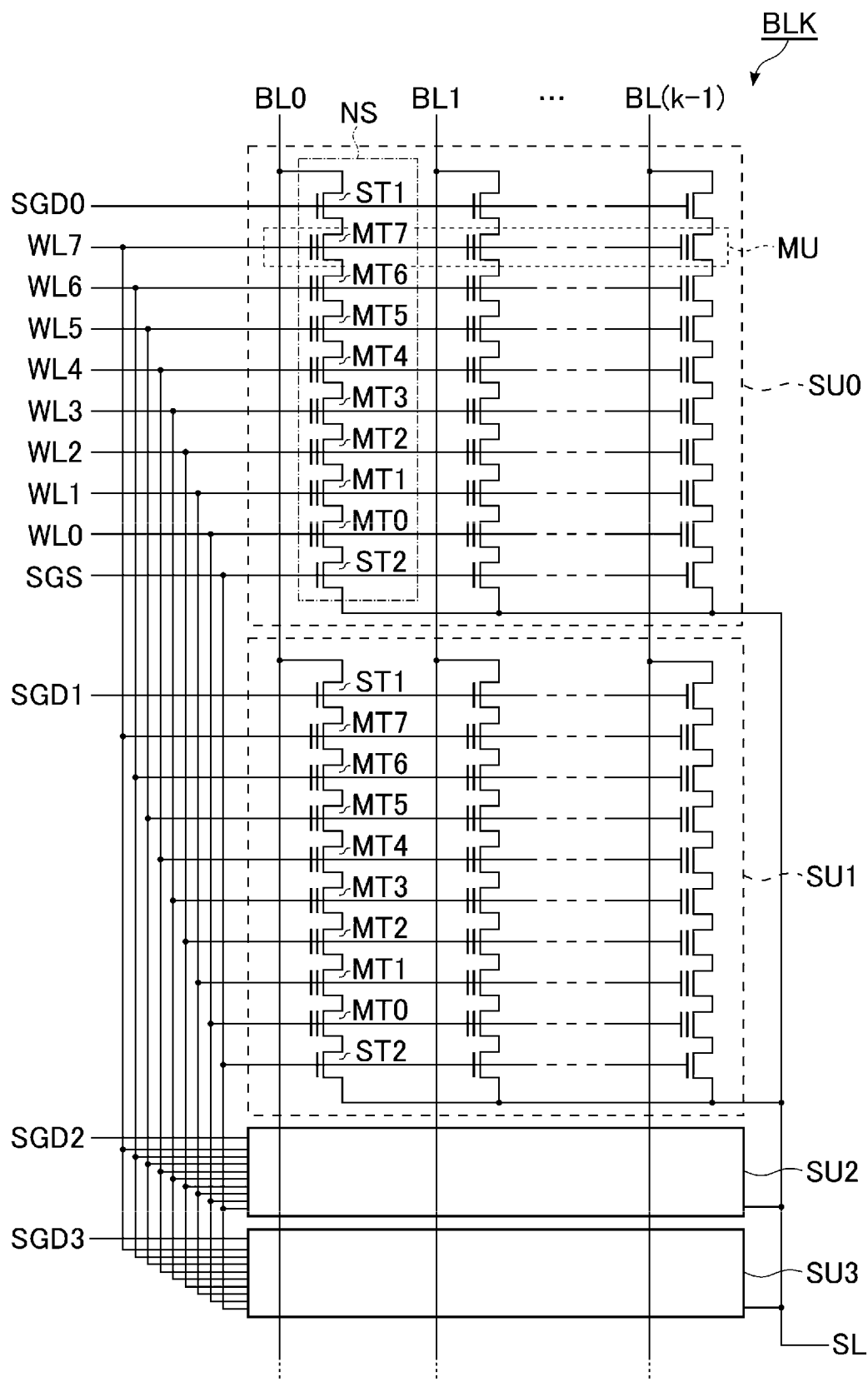
FIG. 3 is a circuit diagram showing a configuration of a memory cell array of the semiconductor storage device according to the first embodiment.

Next, a configuration of a memory cell array of the semiconductor storage device according to the first embodiment will be described with reference to FIG. 3. FIG. 3 is a circuit diagram showing an example of a configuration of the memory cell array of the semiconductor storage device according to the first embodiment.

As shown in FIG. 3, the block BLK includes, for example, four string units SU (SU0, SU1, SU2, and SU3). Each string unit SU includes a plurality of NAND strings NS.

Each of the NAND strings NS includes, for example, eight memory cell transistors MT (MT0 to MT7), a select transistor ST1, and a select transistor ST2. The number of memory cell transistors MT provided in each of the NAND strings NS is not limited to eight, and may be 16, 32, 48, 64, 96, 128, or the like. Alternatively, the number of memory cell transistors MT provided in each of the NAND strings NS is not limited. Each memory cell transistor MT may be provided with a stacked gate including a control gate portion and a charge storage portion. The memory cell transistors MT may be connected in series between the select transistor ST1 and the select transistor ST2.

In one block BLK, gates of the select transistors ST1 in the string units SU0 to SU3 may be respectively connected to select gate lines SGD0 to SGD3. Gates of the select transistors ST2 in all of the string units SU in the block BLK may be commonly connected to a select gate line SGS. Similar to the select gate line SGD, the select gate line SGS may be divided for each of the select transistors ST2 in the string units SU0 to SU3 (that is, the gates of the select transistors ST2 in the string units SU0 to SU3 may be respectively connected to select gate lines SGS0 to SGS3 (not shown)). Control gates of the memory cell transistors MT0 to MT7 in the same block BLK may be respectively connected to word lines WL0 to WL7. That is, the word lines WL of the same address may be commonly connected to all of the string units SU in the same block BLK, and the select gate line SGS may be commonly connected to all of the string units SU in the same block BLK. On the other hand, the select gate line SGD may be connected to only one of the string units SU in the same block BLK.

Among the NAND strings NS arranged in a matrix manner in the memory cell array 10, the other terminal of the select transistor ST1 in one of the NAND strings NS may be connected to one of k bit lines BL (BL0 to BL(k−1) (k is an integer of 1 or more)) in the same row. The bit lines BL may be commonly connected to NAND strings NS in the same column across a plurality of blocks BLK.

The other terminal of the select transistor ST2 may be connected to a source line SL. The source line SL may be commonly connected to a plurality of NAND strings NS across a plurality of blocks BLK.

As described above, for example, data erase is collectively executed for the memory cell transistors MT in the same block BLK. In contrast, data read and write can be collectively executed for a plurality of memory cell transistors MT commonly connected any one of the word lines WL in any one of the string units SU of any one of the blocks BLK. In this manner, a set of memory cell transistors MT that share a word line WL in one string unit SU is referred to as, for example, a memory cell unit MU. That is, the memory cell unit MU is a set of memory cell transistors MT in which a write operation or a read operation can be collectively executed.

A unit of a data string of one-bit data stored in each of a plurality of memory cell transistors MT in the memory cell unit MU is defined as a "page". For example, when two-bit data can be stored in the memory cell transistors MT, two pages of data are stored in the memory cell unit MU. The memory cell transistors MT are not limited to be capable of storing two-bit data, and may be capable of storing three-bit or more-bit data.

1.1.5 Cross-sectional Structure of Semiconductor Storage Device

Figure 4:
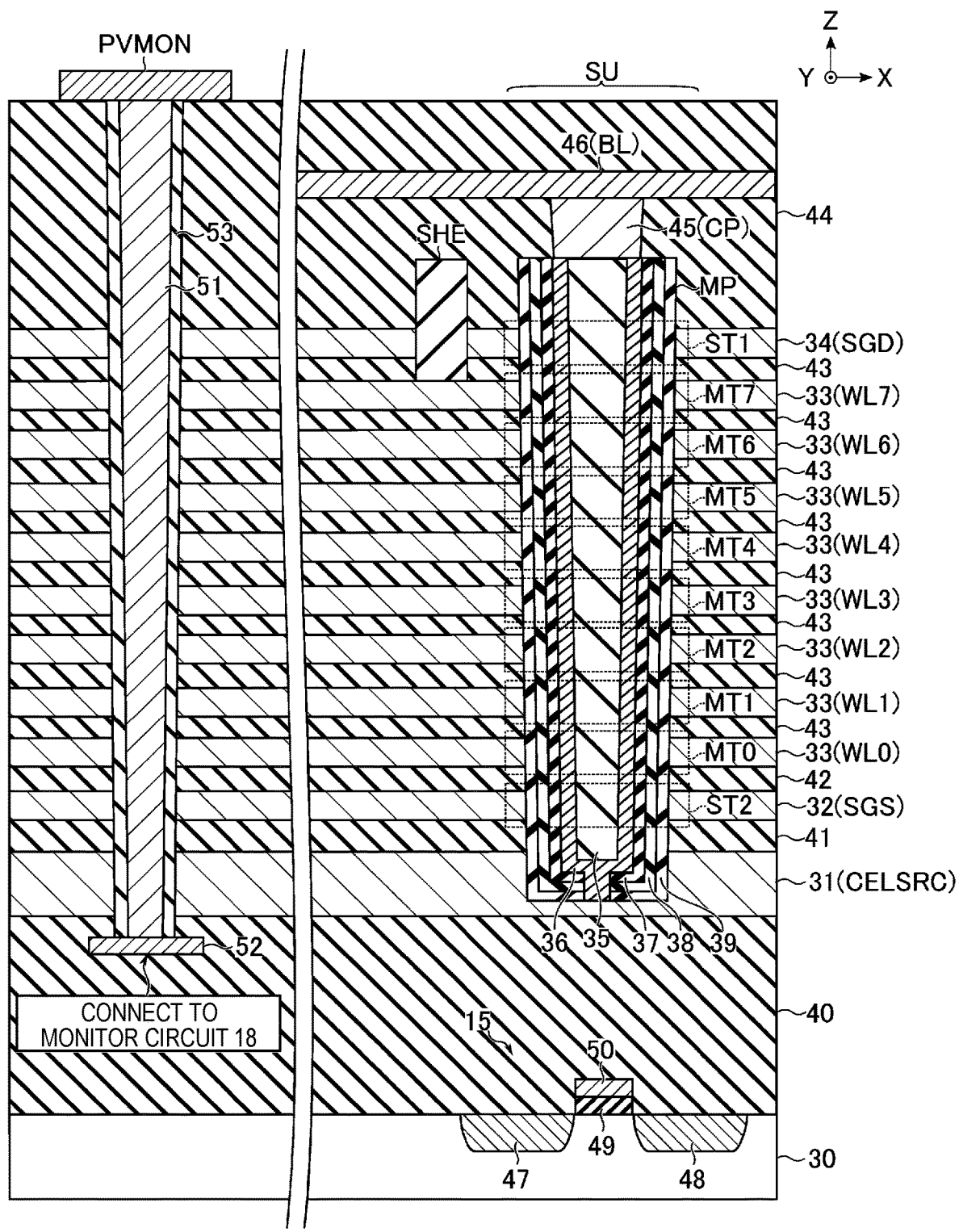
FIG. 4 is a cross-sectional view showing an example of a cross-sectional structure of the memory cell array of the semiconductor storage device according to the first embodiment.

Next, a cross-sectional structure of the semiconductor storage device according to the first embodiment will be described with reference to FIG. 4. FIG. 4 shows an example of the cross-sectional structure of the semiconductor storage device 1 according to the first embodiment.

In the following reference drawings, an X axis corresponds to an extension direction of the bit line BL, a Y axis corresponds to an extension direction of the word line WL, and a Z axis corresponds to a vertical direction with respect to a surface of a semiconductor substrate on which the semiconductor storage device 1 is formed.

The memory cell array 10 may include conductor layers 31, 32, 33, 34, 45, and 46 provided above a semiconductor substrate 30, and a plurality of memory pillars MP (only one memory pillar is shown in FIG. 4).

An insulator layer 40 may be provided on the semiconductor substrate 30. The conductor layer 31 may be stacked on the insulator layer 40. The conductor layer 31 is formed into, for example, a plate shape extending along an XY plane. The conductor layer 31 may be used as the source line SL. The conductor layer 31 may be formed of a conductive material, for example, an N-type semiconductor into which impurities are added, or a metal material. The conductor layer 31 may have a stacking structure including, for example, a semiconductor and a metal.

An insulator layer 41 may be provided on the conductor layer 31. The conductor layer 32 may be stacked on the insulator layer 41. The conductor layer 32 may be formed into, for example, a plate shape extending along the XY plane. The conductor layer 32 may be used as the select gate line SGS. The conductor layer 32 contains, for example, tungsten.

An insulator layer 42 may be provided on the conductor layer 32. Eight conductor layers 33 and eight insulator layers 43 may be stacked on the insulator layer 42 in an order of the conductor layer 33, the insulator layer 43, . . . the conductor layer 33, the insulator layer 43. The conductor layer 33 is formed into, for example, a plate shape extending along the XY plane. The eight stacked conductor layers 33 may be used as the word lines WL0 to WL7 in order from the conductor layer 31 side. The conductor layer 33 contains, for example, tungsten.

The conductor layer 34 and an insulator layer 44 may be stacked in this order on the uppermost insulator layer 43. The conductor layer 34 may be formed into, for example, a plate shape extending along the XY plane. The stacked conductor layer 34 may be used as the select gate line SGD. The conductor layer 34 contains, for example, tungsten. The conductor layer 34 may be electrically cut off on a string unit SU basis by, for example, a slit SHE.

The conductor layer 46 may be provided above the conductor layer 34. The conductor layer 46 may be formed into, for example, a line shape extending in an X direction, and functions as the bit line BL. The insulator layer 44 may cover above the conductor layer 46.

The plurality of memory pillars MP may extend along a Z direction below the conductor layer 46 and pass through the conductor layers 32 to 34. A bottom portion of each of the memory pillars MP may be positioned below the insulator layer 41 and may be in contact with the conductor layer 31.

Each of the memory pillars MP includes, for example, a core member 35, a semiconductor film 36, a tunnel insulation film 37, a charge storage film 38, and a block insulation film 39.

The core member 35 extends, for example, in the Z direction. An upper end of the core member 35 may be provided in a layer above the conductor layer 34, and a lower end of the core member 35 may be provided in a layer below the conductor layer 32. The core member 35 contains, for example, silicon oxide.

The semiconductor film 36 may cover side surfaces of the core member 35. An upper end of the semiconductor film 36 may reach the same position as the upper end of the core member 35. A lower end of the semiconductor film 36 may cover a lower surface of the core member 35 and is in contact with the conductor layer 31. The semiconductor film 36 contains, for example, polysilicon.

The tunnel insulation film 37 may cover side surfaces of the semiconductor film 36. The tunnel insulation film 37 contains, for example, silicon oxide.

The charge storage film 38 may cover side surfaces of the tunnel insulation film 37. The charge storage film 38 contains, for example, an insulator (for example, silicon nitride) having a trap level.

The block insulation film 39 may cover side surfaces of the charge storage film 38. The block insulation film 39 contains, for example, silicon oxide.

The conductor layer 45 functioning as a columnar contact CP may be provided on the semiconductor film 36 of the memory pillar MP. An upper end of the conductor layer 45 may be in contact with the conductor layer 46.

In the structure of the memory pillar MP described above, a portion where the memory pillar MP and the conductor layer 32 may intersect each other functions as the select transistor ST2. A portion where the memory pillar MP and the conductor layer 33 intersect each other may function as the memory cell transistor MT. A portion where the memory pillar MP and the conductor layer 34 intersect each other may function as the select transistor ST1. The semiconductor film 36 may function as a channel for each of the memory cell transistors MT0 to MT7, the select transistor ST1, and the select transistor ST2. The charge storage film 38 may function as a charge storage portion of the memory cell transistor MT.

Although the charge storage film 38 is a continuous film in the memory pillar MP in the above description, the present embodiment is not limited thereto. For example, the charge storage film 38 may be individually separated and provided for each of the plurality of memory cell transistors MT in a NAND string NS. In this case, the individually separated charge storage films may contain polysilicon or a metal including at least one selected from titanium, tungsten, and ruthenium.

Various circuits 11 to 18 other than the memory cell array 10 may be formed below the memory cell array 10. FIG. 4 shows an example of a metal-oxide-semiconductor field effect transistor (MOSFET) constituting the voltage generation circuit 15.

In a region of the voltage generation circuit 15, a source layer 47 and a drain layer 48 may be formed at a predetermined interval in the semiconductor substrate 30. A gate electrode 50 may be provided between the source layer 47 and the drain layer 48 on the semiconductor substrate 30 via a gate insulation film 49. With such a configuration, a MOSFET structure may be formed on the semiconductor substrate 30. Although only one MOSFET structure is shown as an example of a configuration provided in the voltage generation circuit 15, the configuration in FIG. 4 is an example and the voltage generation circuit 15 may include other configurations.

A monitor target node inside the voltage generation circuit 15 or the like may be connected to the monitor circuit 18 formed on the semiconductor substrate 30, similar to the voltage generation circuit 15. As described above, the monitor circuit 18 may compare a voltage of the monitor target node with the reference voltage VMON supplied from the pad PVMON. Therefore, a contact 51 may be provided for transferring the reference voltage VMON supplied from the pad PVMON to the monitor circuit 18 formed on the semiconductor substrate 30.

The contact 51 may extend along the Z direction in a region that does not overlap the memory pillar MP, and passes through the conductor layers 31 to 34. Side surfaces of the contact 51 may be covered with, for example, an insulation film 53, and the contact 51 may be electrically insulated from the conductor layers 31 to 34. A bottom portion of the contact 51 may be positioned below the conductor layer 31 and may be connected to an upper surface of a wiring layer 52 connected to the monitor circuit 18. Accordingly, the monitor circuit 18 provided below the memory cell array 10 and the pad PVMON provided above the memory cell array 10 may be electrically connected to each other via the contact 51.

1.1.6 Configuration of Monitor Circuit

Next, a circuit configuration of the monitor circuit 18 provided in the semiconductor storage device 1 according to the first embodiment will be described with reference to a circuit diagram shown in FIG. 5.

Figure 5:
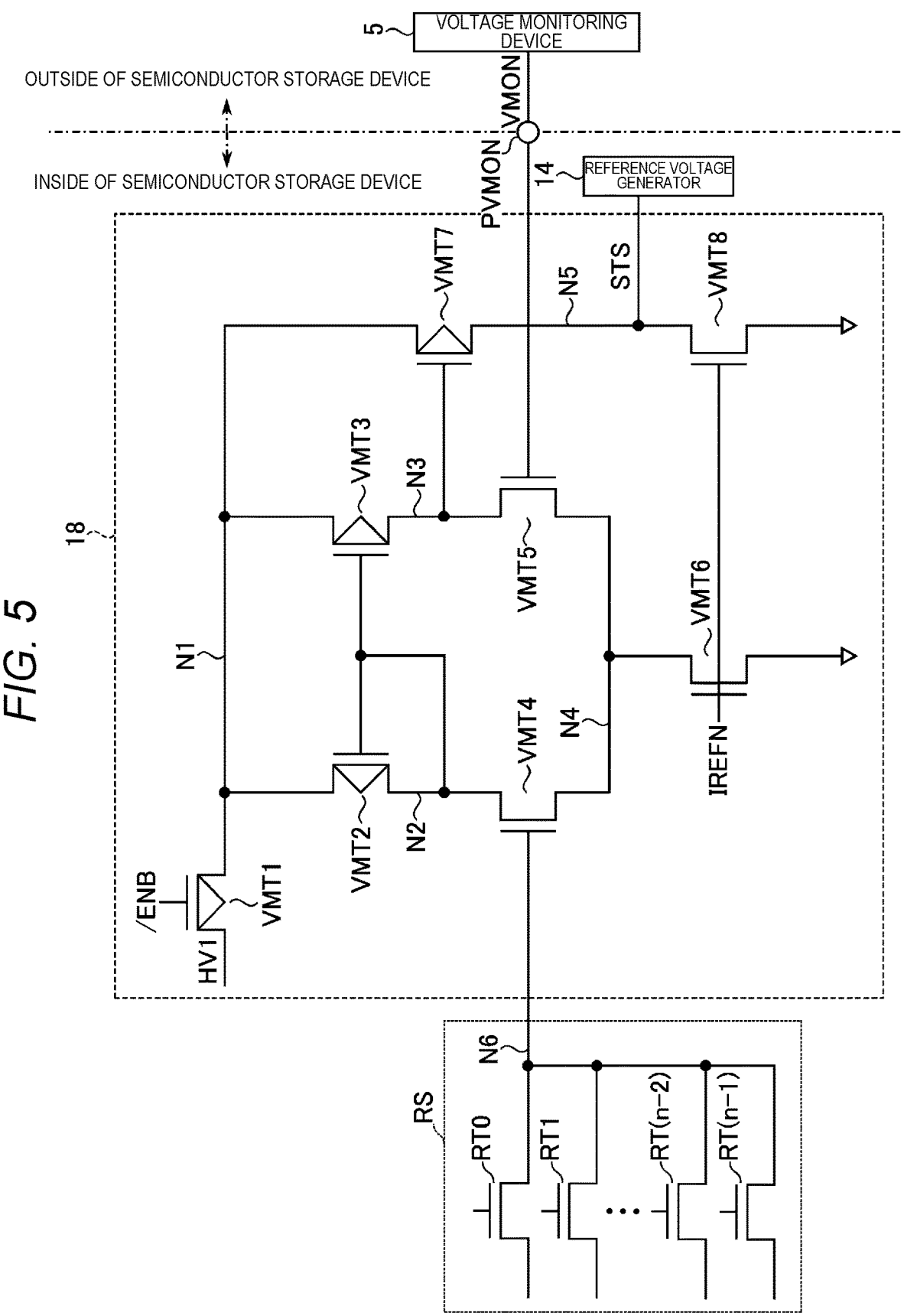
FIG. 5 is a circuit diagram showing an example of a circuit configuration of a monitor circuit in the semiconductor storage device according to the first embodiment.

As shown in FIG. 5, the monitor circuit 18 includes, for example, P-type transistors VMT1, VMT2, VMT3, and VMT7, and N-type transistors VMT4, VMT5, VMT6, and VMT8.

A power supply voltage HV1 may be applied to a first terminal of the transistor VMT1, and a second terminal of the transistor VMT1 may be connected to a node N1. A gate of the transistor VMT1 may receive a signal/ENB from the reference voltage generator 14, for example. When a "L" level signal/ENB is received, the transistor VMT1 may be turned on and transfers the power supply voltage HV1 to the node N1 to drive the monitor circuit 18.

A first terminal of the transistor VMT2 may be connected to the node N1. A gate of the transistor VMT2 and a second terminal of the transistor VMT2 may be connected to a node N2.

A first terminal of the transistor VMT3 may be connected to the node N1. A gate of the transistor VMT3 may be connected to the node N2. A second terminal of the transistor VMT3 may be connected to a node N3.

The transistor VMT2 and the transistor VMT3 may form a current mirror circuit. The current mirror circuit may generate a current flowing into the transistor VMT3 based on a current flowing through the transistor VMT2.

A first terminal of the transistor VMT4 may be connected to the node N2. A gate of the transistor VMT4 may function as a second input terminal of the monitor circuit 18, and may be connected to a monitor target node via, for example, a relay switch RS provided outside the monitor circuit 18. Accordingly, a voltage of the monitor target node may be applied to the gate of the transistor VMT4. A second terminal of the transistor VMT4 may be connected to a node N4.

A first terminal of the transistor VMT5 may be connected to the node N3. A gate of the transistor VMT5 may function as a first input terminal of the monitor circuit 18. The reference voltage VMON may be applied from the voltage monitoring device 5 to the gate of the transistor VMT5 via the pad PVMON. A second terminal of the transistor VMT5 may be connected to the node N4.

A first terminal of the transistor VMT6 may be connected to the node N4. A gate of the transistor VMT6 may receive a signal IREFN from the reference voltage generator 14, for example. The signal IREFN may be received to drive the transistor VMT6 when the monitor circuit 18 is enabled. A second terminal of the transistor VMT6 may be connected to, for example, a ground terminal. The transistor VMT6 may have a function of discharging a current flowing in the monitor circuit 18 from the node N1 via the transistor VMT4 and a current flowing in the monitor circuit 18 from the node N1 via the transistor VMT 5 toward the ground terminal.

A first terminal of the transistor VMT7 may be connected to the node N1. A gate of the transistor VMT7 may be connected to the node N3. A second terminal of the transistor VMT7 may be connected to a node N5. The node N5 may function as an output terminal of the monitor circuit 18 and may be connected to the reference voltage generator 14.

A first terminal of the transistor VMT8 may be connected to the node N5. A gate of the transistor VMT8 and the gate of the transistor VMT7 may receive the signal IREFN from the reference voltage generator 14. The transistor VMT8 may be driven when the monitor circuit 18 is enabled. A second terminal of the transistor VMT8 may be connected to, for example, a ground terminal.

The transistor VMT8 may function as a discharge path through which a current flowing in the monitor circuit 18 from the node 1 via the transistor VMT7 flows to the ground terminal. The transistor VMT8 may have a function of discharging, toward the ground terminal, a current flowing from anode in a peripheral circuit connected to the transistor VMT4 into the monitor circuit 18.

With the above configuration, a voltage of the node N5 in the monitor circuit 18 is at a "L" level when the reference voltage VMON is smaller than a voltage of the monitor target node, and is at a "H" level when the reference voltage VMON is equal to or larger than a voltage of the monitor target node. Accordingly, the monitor circuit 18 can output, to the reference voltage generator 14, a comparison result between the voltage of the monitor target node applied to the second input terminal of the monitor circuit 18 (e.g., the gate of the transistor VMT4) and the reference voltage VMON applied to the first input terminal of the monitor circuit 18 (e.g., the gate of the transistor VMT5).

The relay switch RS provided outside the monitor circuit 18 includes, for example, n (n is an integer of 1 or more) transistors RT (RT0, RT1, RT(n−1)). A first terminal of each of the n transistors RT may be connected to a corresponding node among a plurality of different nodes in the peripheral circuit. Second terminals of the n transistors RT may be commonly connected to a node N6. The node N6 may be connected to the gate of the transistor VMT4 in the monitor circuit 18. The relay switch RS may be controlled by, for example, the reference voltage generator 14, and turn on any one of then transistors RT. Accordingly, a corresponding node in the peripheral circuit may be connected to the gate of the transistor VMT4 in the monitor circuit 18 via the node N6.

Although the relay switch RS is provided outside the monitor circuit 18 in the above description, the present embodiment is not limited thereto. The relay switch RS may be provided in the monitor circuit 18. In this case, the second input terminal of the monitor circuit 18 may be a first terminal of a transistor RT connected to the monitor target node among the transistors RT provided in the relay switch RS.

1.1.7 Configuration of Voltage Generation Circuit

Next, a circuit diagram of the voltage generation circuit 15 as an example of a circuit that includes the monitor target node and is connected to the monitor circuit 18 provided in the semiconductor storage device 1 according to the first embodiment will be described with reference to FIG. 6.

Figure 6:
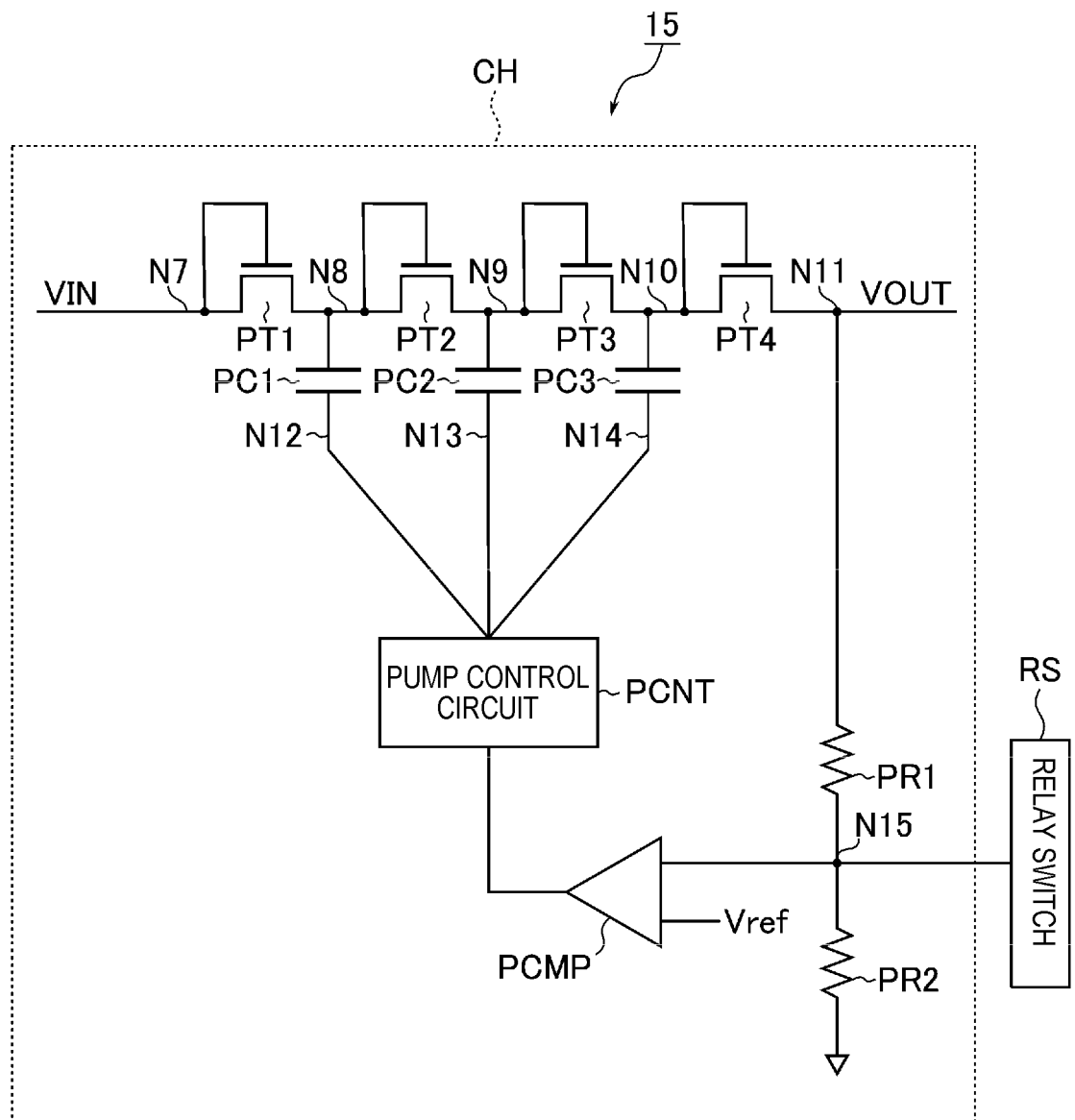
FIG. 6 is a circuit diagram showing an example of a circuit configuration of a voltage generation circuit in the semiconductor storage device according to the first embodiment.

As shown in FIG. 6, the voltage generation circuit 15 includes, for example, a high voltage generator. The high voltage generator includes, for example, transistors PT1 to PT4, capacitors PC1 to PC3, resistors PR1 and PR2, a comparator PCMP, and a pump control circuit PCNT.

Each of the transistors PT1 to PT4 is, for example, an N-type transistor having a high breakdown voltage.

A first terminal and a gate of the transistor PT1 may be commonly connected to a node N7, and an input voltage VIN may be applied to the first terminal and the gate of the transistor PT1. A second terminal of the transistor PT1 may be connected to a node N8. A first terminal and a gate of the transistor PT2 may be commonly connected to the node N8. A second terminal of the transistor PT2 may be connected to a node N9. A first terminal and a gate of the transistor PT3 may be commonly connected to the node N9. A second terminal of the transistor PT3 may be connected to a node N10. A first terminal and a gate of the transistor PT4 may be commonly connected to the node N10. A second terminal of the transistor PT4 may be connected to a node N11 and outputs an output voltage VOUT.

A first terminal of the capacitor PC1 may be connected to the node N8. A second terminal of the capacitor PC1 may be connected to a node N12. A first terminal of the capacitor PC2 may be connected to the node N9. A second terminal of the capacitor PC2 may be connected to a node N13. A first terminal of the capacitor PC3 may be connected to the node N10. A second terminal of the capacitor PC3 may be connected to a node N14.

A first terminal of the resistor PR1 may be connected to the node N11, and a second terminal of the resistor PR1 may be connected to a node N15. A first terminal of the resistor PR2 may be connected to the node N15, and a second terminal of the resistor PR2 may be grounded. Accordingly, a voltage of the node N15 in the high voltage generator can change corresponding to the output voltage VOUT.

The comparator PCMP may have a first input terminal, a second input terminal, and an output terminal. The first input terminal of the comparator PCMP may be connected to the node N15. A reference voltage Vref may be applied to the second input terminal of the comparator PCMP. The output terminal of the comparator PCMP may be connected to the pump control circuit PCNT. The output terminal of the comparator PCMP may output a signal based on a comparison between a voltage of the first input terminal and a voltage of the second input terminal of the comparator PCMP.

The pump control circuit PCNT may be connected to the output terminal of the comparator PCMP. The pump control circuit PCNT may be connected to the nodes N12 to N14, and control voltages of the nodes N12 to N14 based on an output signal of the comparator PCMP. More specifically, the pump control circuit PCNT may indirectly detect the voltage VOUT via, for example, the comparator PCMP, and control the voltages of the nodes N12 to N14 to appropriately charge the capacitors PC1 to PC3.

With the above configuration, the high voltage generator can step up the input voltage VIN to a desired output voltage VOUT and output the output voltage VOUT.

The monitor circuit 18 monitors, for example, the node N15 in the high voltage generator as a monitor target node. More specifically, the monitor circuit 18 may monitor a voltage of the node N15 by using a comparison circuit to compare the voltage of the node N15 connected to the second input terminal of the monitor circuit 18 with the reference voltage VMON applied to the first input terminal of the monitor circuit 18, which will be described later. Accordingly, the monitor circuit 18 can monitor a voltage state of a node in the voltage generation circuit 15 without affecting the voltage state of the node even when the node is a high impedance node in a resistance voltage divider circuit, such as the node N15.

The number of the transistors PT and the capacitors PC in the circuit configuration of the high voltage generator described above is merely an example, and is not limited thereto. The number of transistors PT connected in series in the high voltage generator and the number of capacitors PC connected to nodes between adjacent transistors can be appropriately changed corresponding to a target value of a stepped-up voltage. The reference voltage Vref can be appropriately changed corresponding to a value of a target output voltage VOUT.

1.2 Voltage Monitoring Operation

Figure 7:
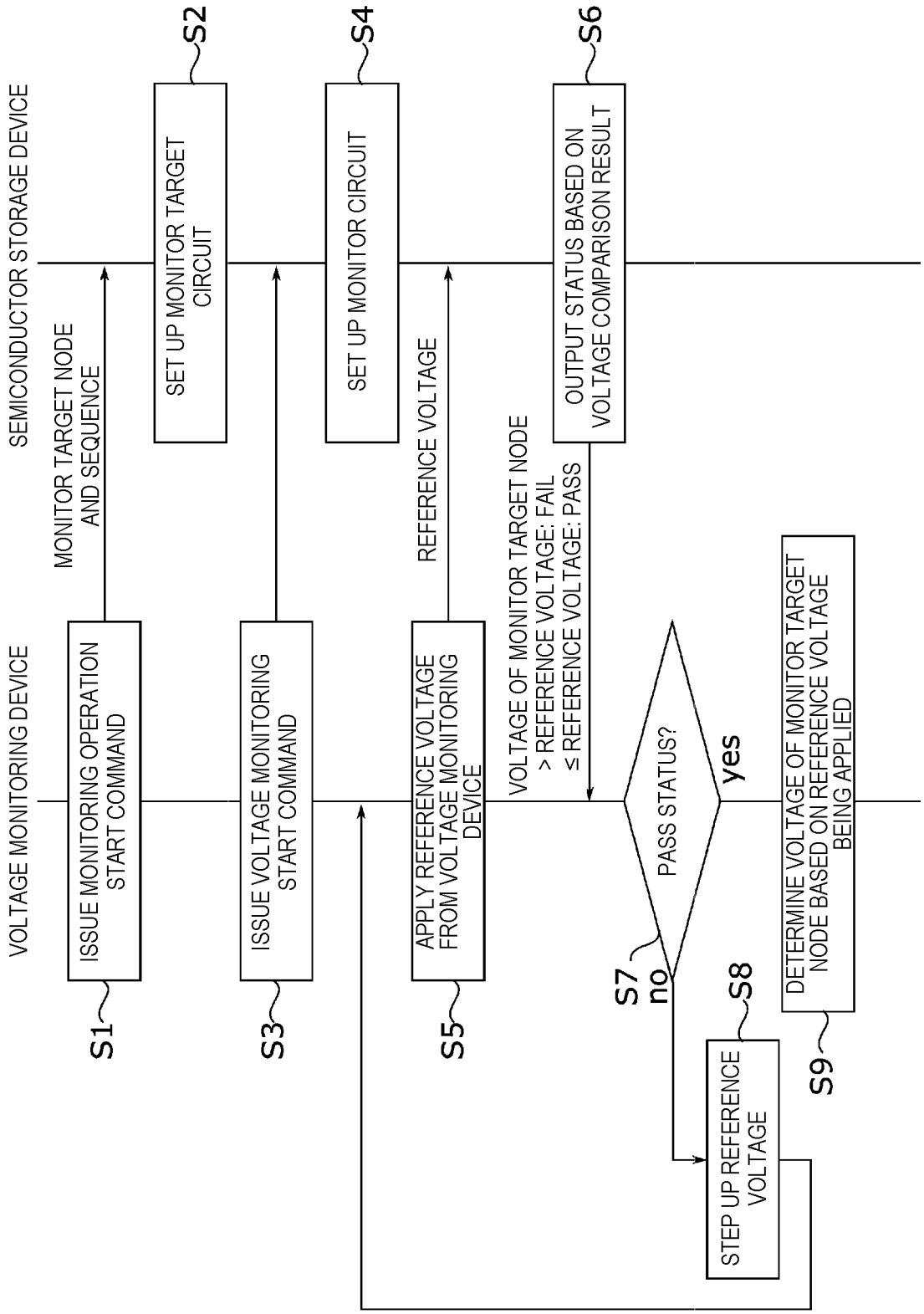
FIG. 7 is a flowchart showing an internal voltage monitoring operation of the semiconductor storage device according to the first embodiment.
Figure 8:
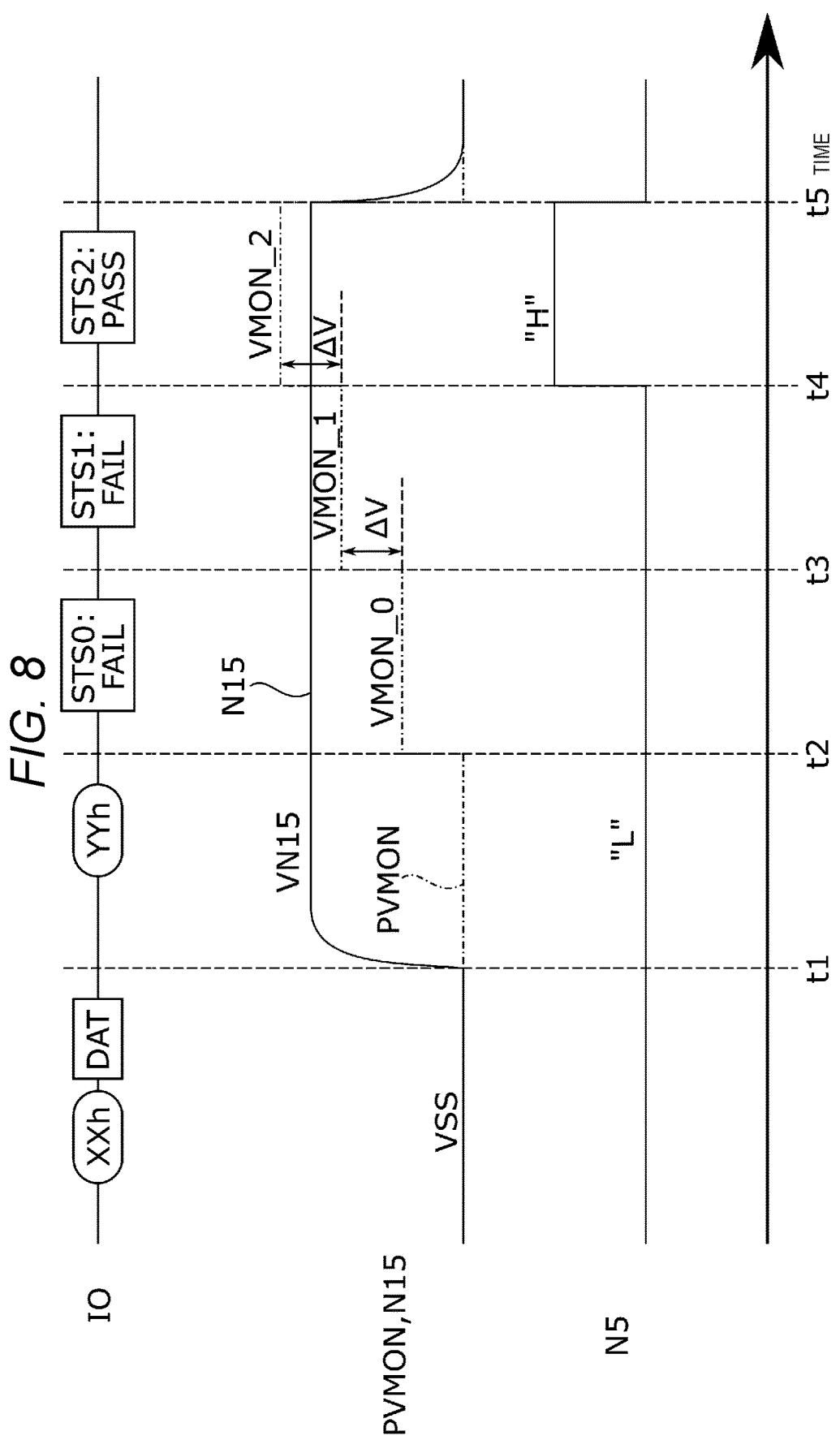
FIG. 8 is a command sequence and timing chart showing the internal voltage monitoring operation of the semiconductor storage device according to the first embodiment.

Next, a voltage monitoring operation of the semiconductor storage device 1 according to the first embodiment will be described with reference to FIGS. 7 and 8. FIG. 7 is a flowchart showing a voltage monitoring operation according to the first embodiment. FIG. 8 is a command sequence and timing chart showing the voltage monitoring operation according to the first embodiment.

The semiconductor storage device 1 according to the first embodiment may use the monitor circuit 18 to compare the voltage of the monitor target node with the reference voltage VMON applied by the external voltage monitoring device 5 and transfer a status STS based on the comparison result to the voltage monitoring device 5 via the pad PVMON. The voltage monitoring device 5 may determine the voltage of the monitor target node based on the transferred status STS.

First, the flowchart of the voltage monitoring operation will be described with reference to FIG. 7.

As shown in FIG. 7, in step S1, the voltage monitoring device 5 may issue a monitoring operation start command and send the monitoring operation start command to the semiconductor storage device 1. The monitoring operation start command may be a command for specifying a circuit (a monitor target circuit) including the monitor target node and instructing the semiconductor storage device 1 to set up the circuit, in order to monitor the voltage of the monitor target node. The monitoring operation start command includes, for example, information on the monitor target node and a sequence.

In step S2, the semiconductor storage device 1 may start to set up the monitor target circuit when receiving the monitoring operation start command. Specifically, the semiconductor storage device 1 may operate, in accordance with a predetermined sequence, the circuit specified by the monitoring operation start command and increases the voltage of the monitor target node.

In step S3, the voltage monitoring device 5 may issue a voltage monitoring start command and sends the voltage monitoring start command to the semiconductor storage device 1. The voltage monitoring start command may be a command for instructing the semiconductor storage device 1 to start a series of operations of setting up the monitor circuit 18 and outputting a voltage comparison result as the status STS by the monitor circuit 18.

In step S4, the voltage monitoring device 5 may start to set up the monitor circuit 18. Specifically, the reference voltage generator 14 may supply a "L" level signal /ENB to turn on the transistor VMT1 in the monitor circuit 18 and drive the monitor circuit 18. The reference voltage generator 14 may turn on a transistor for connecting to the monitor target circuit among the transistors RT0 to RT(n−1) in the relay switch RS. Accordingly, the voltage of the monitor target node may be transferred to the gate of the transistor VMT4 in the monitor circuit 18.

In step S5, the voltage monitoring device 5 may apply the reference voltage VMON to the gate of the transistor VMT5 in the monitor circuit 18 via the pad PVMON. Accordingly, the monitor circuit 18 may output a comparison result between the reference voltage VMON and the voltage of the monitor target node to the reference voltage generator 14 via the node N5.

In step S6, the reference voltage generator 14 may output the status STS based on the voltage comparison result in step S5 to the voltage monitoring device 5. Specifically, when the voltage of the monitor target node is larger than the reference voltage VMON, the reference voltage generator 14 may output a fail status STS, and when the voltage of the monitor target node is equal to or smaller than the reference voltage VMON, the reference voltage generator 14 may output a pass status STS.

In step S7, the voltage monitoring device 5 may determine whether the status STS output in step S6 is a pass status. When the status STS is a fail status (step S7: no), the processing may proceed to step S8, and when the status STS is a pass status (step S7: yes), the processing may proceed to step S9.

In step S8, the voltage monitoring device 5 may step up the reference voltage VMON and return the processing to step S5. Accordingly, steps S5 to S8 may be repeated until the voltage of the monitor target node is equal to or smaller than the reference voltage value VMON.

In step S9, the voltage monitoring device 5 may determine the voltage of the monitor target node based on the reference voltage VMON being applied. For example, the voltage monitoring device 5 determines that the voltage of the monitor target node is between the reference voltage VMON being applied and a reference voltage VMON before the reference voltage level VMON being applied is stepped up.

After the above steps, the voltage monitoring operation may be ended.

Next, a command sequence and timing chart of the voltage monitoring operation will be described with reference to FIG. 8. FIG. 8 shows a case in which the node N15 in the voltage generation circuit 15 is selected as the monitor target node, and a voltage of the node N15 and a voltage of the pad PVMON are respectively indicated by a solid line and a dashed-dotted line.

As shown in FIG. 8, the voltage monitoring device 5 may continuously issue a monitoring operation start command "XXh" and data DAT, and send the monitoring operation start command "XXh" and the data DAT to the semiconductor storage device 1. The data DAT includes, for example, information specifying that the node N15 in the voltage generation circuit 15 is the monitor target node and specifying a sequence for increasing a voltage of the node N15 to a voltage VN15 that is larger or smaller than a ground voltage VSS.

When receiving the monitoring operation start command "XXh" and the data DAT, at a time point t1, the semiconductor storage device 1 may start to set up the voltage generation circuit 15 and increase the voltage of the node N15 to the voltage VN15.

Subsequently, the voltage monitoring device 5 may issue a voltage monitoring start command "YYh" and send the voltage monitoring start command "YYh" to the semiconductor storage device 1.

When receiving the voltage monitoring start command "YYh", the semiconductor storage device 1 may start to set up the monitor circuit 18 at a time point t2. Specifically, the reference voltage generator 14 may drive the monitor circuit 18 to transfer the voltage VN15 of the node N15 to the gate of the transistor VMT4. The voltage monitoring device 5 may apply a reference voltage VMON_0 to the gate of the transistor VMT5 via the pad PVMON. The monitor circuit 18 may send a comparison result between the voltage VN15 and the reference voltage VMON_0 to the reference voltage generator 14 via the node N5. Since the voltage VN15 is larger than the reference voltage VMON_0, the node N5 in the monitor circuit 18 is at a "L" level. Based on the comparison result, i.e., the "L" level, the reference voltage generator 14 may output a fail status STS0 to the voltage monitoring device 5 via the input and output circuit 11.

At a time point t3, when receiving the fail status STS, the voltage monitoring device 5 may apply a reference voltage VMON_1 obtained by stepping up the reference voltage VMON_0 by ΔV to the pad PVMON. The monitor circuit 18 may send a comparison result between the voltage VN15 and the reference voltage VMON_1 to the reference voltage generator 14 via the node N5. Since the voltage VN15 is larger than the reference voltage VMON_1, the node N5 in the monitor circuit 18 continues to be at the "L" level. Based on the comparison result, i.e., the "L" level, the reference voltage generator 14 may output a fail status STS1 to the voltage monitoring device 5 via the input and output circuit 11.

At a time point t4, when receiving the fail status STS, the voltage monitoring device 5 may apply a reference voltage VMON_2 obtained by stepping up the reference voltage VMON_1 by ΔV to the pad PVMON. The monitor circuit 18 may send a comparison result between the voltage VN15 and the reference voltage VMON_2 to the reference voltage generator 14 via the node N5. Since the voltage VN15 is equal to or smaller than the reference voltage VMON_2, the node N5 in the monitor circuit 18 is at a "H" level. Based on the comparison result, i.e., the "H" level, the reference voltage generator 14 may output a pass status STS2 to the voltage monitoring device 5 via the input and output circuit 11.

At a time point t5, when receiving the pass status STS, the voltage monitoring device 5 may determine that the voltage VN15 of the node N15 is between the reference voltage VMON_1 and the reference voltage VMON_2, and apply the voltage VSS to the pad PVMON. Accordingly, the semiconductor storage device 1 may stop operations of the monitor circuit 18 and the voltage generation circuit 15, and ends the voltage monitoring operation.

In the voltage monitoring operation described above, the reference voltage generator 14 may output the status STS based on a comparison result in the monitor circuit 18 in step S6, and the voltage monitoring device 5 determines the status STS in step S7. However, these steps may also be considered as a step in which the reference voltage generator 14 determines a comparison result in the monitor circuit 18 and outputs a status STS instructing the voltage monitoring device 5 to execute a predetermined operation based on the determination. Specifically, in this step, when the voltage of the monitor target node is larger than the reference voltage VMON, the reference voltage generator 14 may output, to the voltage monitoring device 5, a fail status STS instructing to step up the reference voltage VMON, and when the voltage of the monitor target node is equal to or smaller than the reference voltage VMON, the reference voltage generator 14 may output, to the voltage monitoring device 5, a pass status STS instructing to specify the voltage of the monitor target node.

Although a voltage applied by the voltage monitoring device 5 is gradually increased in the above description, the present embodiment is not limited thereto. For example, the voltage monitoring device 5 may gradually reduce an applied voltage via the PVMON. In this case, when the status STS is a pass status in step S7, the processing may proceed to step S9, and when the status STS is a fail status, the processing may proceed to step S8. In step S8, the voltage monitoring device 5 may step down the reference voltage VMON and returns the processing to step S5.

1.3 Effect

According to the first embodiment, the semiconductor storage device 1 may be provided with the monitor circuit 18 including a second input terminal connected to a monitor target node in a peripheral circuit, a first input terminal connected to the voltage monitoring device 5, and an output terminal connected to the reference voltage generator 14. The monitor circuit 18 may compare the voltage of the monitor target node applied to the second input terminal with the reference voltage VMON applied to the first input terminal, and output a status STS based on the comparison from the output terminal. The voltage monitoring device 5 may increase (or reduce) the reference voltage VMON based on the status output from the semiconductor storage device 1, and determine the voltage of the monitor target node based on the reference voltage VMON when the status STS is changed. In some embodiments, the first input terminal of the monitor circuit 18 and the second input terminal of the monitor circuit 18 are not electrically connected. Accordingly, during the voltage monitoring operation, an increase in a current flowing from the monitor target node connected to the second input terminal of the monitor circuit 18 into the voltage monitoring device 5 connected to the first input terminal of the monitor circuit 18 can be prevented. Therefore, a change in the voltage of the monitor target node due to the voltage monitoring operation can be prevented in an evaluation of a voltage characteristic of a node in a peripheral circuit. Therefore, reliability of the semiconductor storage device 1 can be improved.

2. Second Embodiment

Next, a semiconductor storage device according to a second embodiment will be described. The second embodiment is different from the first embodiment in that the monitor circuit 18 is configured to output, to the pad PVMON, a voltage obtained by stepping down the voltage of the monitor target node. The voltage monitoring device 5 may measure the voltage output to the pad PVMON, and determine the voltage of the monitor target node based on the measured voltage. Hereinafter, description of configurations and operations the same as those in the first embodiment will be omitted, and configurations and operations different from those in the first embodiment will be mainly described.

2.1 Configuration

A configuration of the semiconductor storage device 1 according to the second embodiment will be described.

A circuit configuration of the monitor circuit 18 will be described with reference to FIG. 9.

Figure 9:
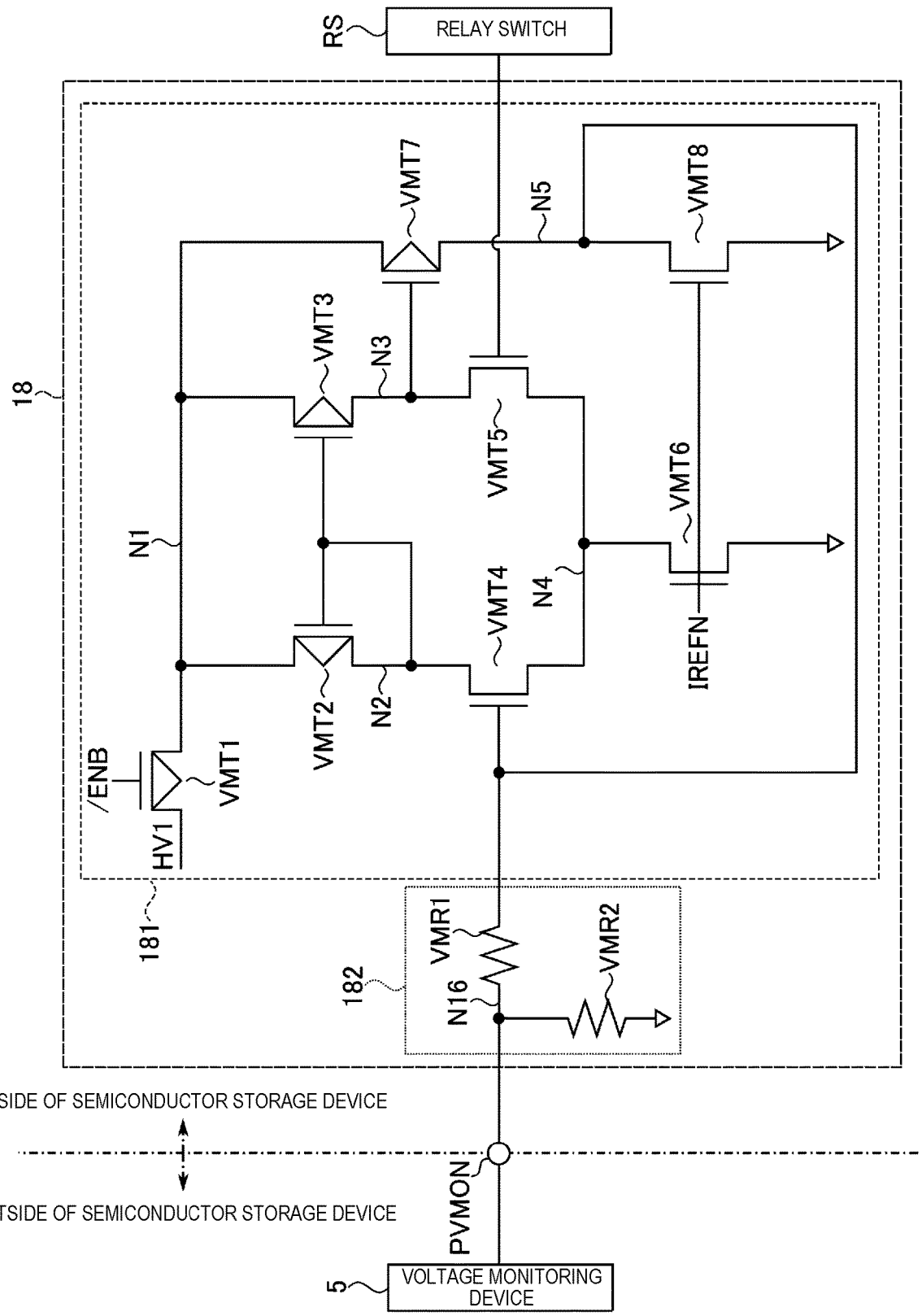
FIG. 9 is a circuit diagram showing an example of a circuit configuration of a monitor circuit in a semiconductor storage device according to a second embodiment.

FIG. 9 is a circuit diagram showing an example of the circuit configuration of the monitor circuit 18 provided in the semiconductor storage device 1 according to the second embodiment.

In the second embodiment, the monitor circuit 18 may include resistors VMR1 and VMR2 in addition to the P-type transistors VMT1, VMT2, VMT3, and VMT7, and the N-type VMT4, VMT5, VMT6, and VMT8. In the following description, a portion including the P-type transistors VMT1, VMT2, VMT3, and VMT7 and the N-type VMT4, VMT5, VMT6, and VMT8 is referred to as a buffer circuit 181, and a portion including the resistors VMR1 and VMR2 is referred to as a step-down circuit 182.

First, a configuration of the buffer circuit 181 will be described.

In the second embodiment, the gate of the transistor VMT4 and the second terminal of the transistor VMT7 may be connected to the node N5. The node N5 may function as an output terminal of the buffer circuit 181.

In the second embodiment, the gate of the transistor VMT5 may function as an input terminal of the monitor circuit 18, and may be connected to a monitor target node via the relay switch RS provided outside the monitor circuit 18. Accordingly, a voltage of the monitor target node may be applied to the input terminal of the monitor circuit 18. Since a configuration of the relay switch RS in the second embodiment is the same as the configuration of the relay switch RS in the first embodiment, the relay switch RS is shown as a block in FIG. 9.

Other configurations provided in the buffer circuit 181 may be the same as those in the first embodiment.

With the above configuration, the buffer circuit 181 may function as a unity gain buffer (unity gain amplifier) that outputs, from the output terminal of the buffer circuit 181, a voltage equal to a voltage applied to the input terminal of the monitor circuit 18.

Next, a configuration of the step-down circuit 182 will be described.

A first terminal of the resistor VMR1 may be connected to the node N5. A second terminal of the resistor VMR1 may be connected to a node N16.

A first terminal of the resistor VMR2 may be connected to the node N16. A second terminal of the resistor VMR2 may be grounded.

The node N16 may be connected to the pad PVMON and serves as an output terminal of the monitor circuit 18, and transfer a voltage obtained by stepping down the voltage of the monitor target node to the voltage monitoring device 5.

With the above configuration, the step-down circuit 182 may step down a voltage output from an output terminal of the buffer circuit 181 and output the voltage to the output terminal of the monitor circuit 18.

2.2 Voltage Monitoring Operation

A voltage monitoring operation using the semiconductor storage device 1 according to the second embodiment will be described with reference to FIG. 10.

Figure 10:
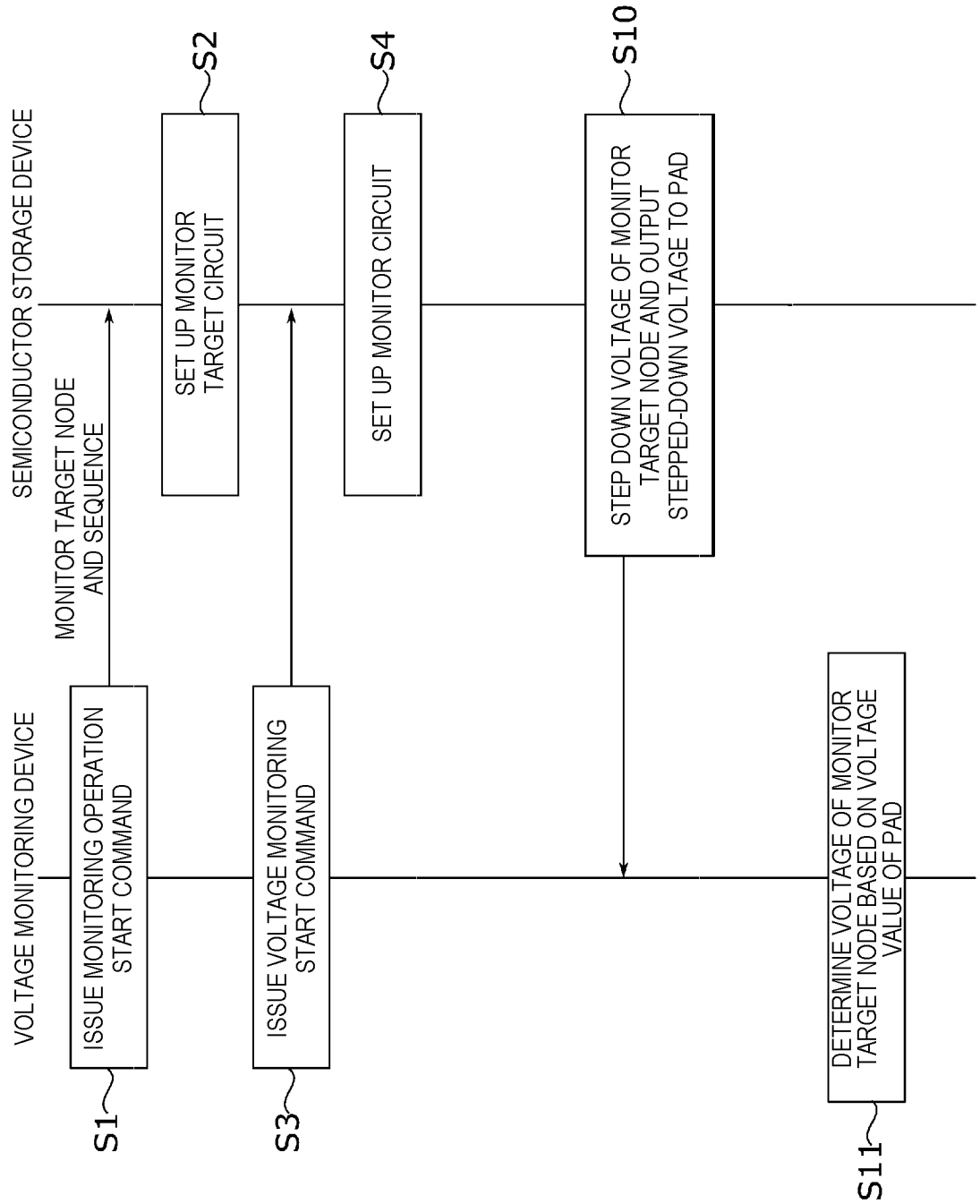
FIG. 10 is a flowchart showing an internal voltage monitoring operation of the semiconductor storage device according to the second embodiment.

FIG. 10 is a flowchart showing an internal voltage monitoring operation according to the second embodiment.

First, as shown in FIG. 10, the semiconductor storage device 1 or the voltage monitoring device 5 may execute an operation the same as that in steps S1 to S4 in the first embodiment. In step S4 in the second embodiment, the reference voltage generator 14 may control the relay switch RS to transfer the voltage of the monitor target node to the gate of the transistor VMT5 in the monitor circuit 18. Accordingly, the buffer circuit 181 in the monitor circuit 18 may output a voltage equal to the voltage of the monitor target node to the node N5.

Next, in step S10, the step-down circuit 182 in the monitor circuit 18 may step down a voltage of the node N16 with respect to a voltage of the node N5, and output the stepped-down voltage to the pad PVMON. Accordingly, for example, the voltage of the pad PVMON becomes a voltage obtained by stepping down the voltage of the monitor target node at a predetermined rate (a step-down rate) by the step-down circuit 182.

In step S11, the voltage monitoring device 5 may measure the voltage of the pad PVMON, and determine the voltage of the monitor target node based on the measured voltage of the pad PVMON. For example, the voltage monitoring device 5 determines that the voltage of the monitor target node is (the measured voltage of the pad PVMON)/(the step-down rate).

After the above steps, the voltage monitoring operation is ended.

2.3 Effect

According to the second embodiment, the monitor circuit 18 may include the buffer circuit 181 that outputs a voltage equal to the voltage of an input voltage of the monitor target node. The input terminal of the buffer circuit 181 (the input terminal of the monitor circuit 18) may be connected to a monitor target node, and the output terminal of the buffer circuit 181 may be connected to the voltage monitoring device 5 via the pad PVMON. In some embodiments, the input terminal of the buffer circuit 181 and the output terminal of the buffer circuit 181 are not electrically connected. Accordingly, during the voltage monitoring operation, an increase in a current flowing from the monitor target node to the voltage monitoring device 5 can be prevented. Therefore, a change in the voltage of the monitor target node due to the voltage monitoring operation can be prevented in an evaluation of a voltage characteristic of a node in a peripheral circuit. Therefore, reliability of the semiconductor storage device 1 can be improved.

The monitor circuit 18 may include the step-down circuit 182 between the output terminal of the buffer circuit 181 and the pad PVMON. The step-down circuit 182 may step down a voltage output to the output terminal of the buffer circuit 181 and outputs the voltage to the pad PVMON. The voltage monitoring device 5 may measure the stepped-down voltage of the monitor target node via the pad PVMON, and determine the voltage of the monitor target node based on the measured voltage. Accordingly, anode having a voltage larger than a voltage that can be input into the voltage monitoring device 5 can be monitored using the voltage monitoring device 5. Therefore, a range of voltages that can be monitored by the voltage monitoring device 5 can be widened. With such a configuration of the monitor circuit 18, the reliability of the semiconductor storage device 1 can also be improved.

2.4 Modification of Second Embodiment

The second embodiment described above may have various modifications.

Hereinafter, a semiconductor storage device according to a modification of the second embodiment will be described. Hereinafter, description of configurations the same as those in the second embodiment will be omitted, and configurations different from those in the second embodiment will be mainly described. Since a voltage monitoring operation in the modification is the same as that in the second embodiment, description thereof will be omitted. The same effect as those in the second embodiment can also be obtained in the modification.

2.4.1 Configuration in Modification

Although the monitor circuit 18 includes the buffer circuit 181 and the step-down circuit 182 in the second embodiment, the present disclosure is not limited thereto. For example, the monitor circuit 18 may further include an attenuation prevention circuit that prevents an attenuation of a high frequency component of a voltage of a monitor target node in addition to the buffer circuit 181 and the step-down circuit 182.

A configuration of the monitor circuit 18 in the modification will be described with reference to FIG. 11.

Figure 11:
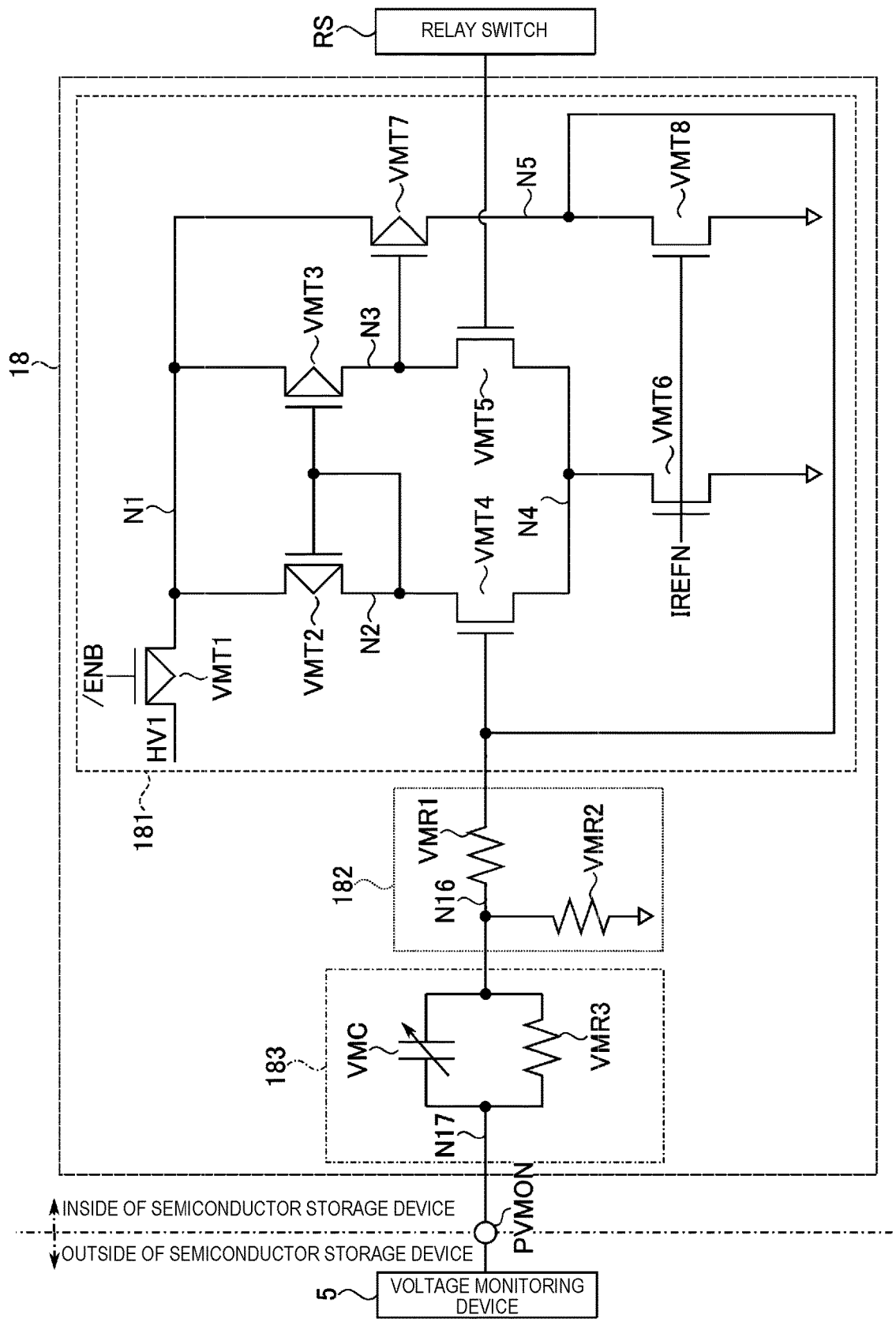
FIG. 11 is a circuit diagram showing an example of a circuit configuration of a monitor circuit in a semiconductor storage device according to a modification of the second embodiment.

FIG. 11 shows an example of a circuit configuration of the monitor circuit 18 in the semiconductor storage device 1 according to the modification.

As shown in FIG. 11, the monitor circuit 18 in the modification includes an attenuation prevention circuit 183 in addition to the configuration of the monitor circuit 18 in the second embodiment.

The attenuation prevention circuit 183 may include a resistor VMR3 and a capacitor VMC. The resistor VMR3 is, for example, a resistance component caused by a circuit or the like provided for connecting the voltage monitoring device 5 and the monitor target node.

A first terminal of the resistor VMR3 may be connected to the node N16. A second terminal of the resistor VMR3 may be connected to a node N17.

A first terminal of the capacitor VMC may be connected to the node N16. A second terminal of the capacitor VMC may be connected to the node N17. The capacitor VMC is, for example, a variable capacitor whose electrostatic capacitance can be changed.

In this manner, the resistor VMR3 and the capacitor VMC may be connected in parallel between the node N16 and the node N17.

The node N17 is connected to, for example, a probe of the voltage monitoring device 5 and may function as an output terminal of the monitor circuit 18.

With such a configuration, two parallel transmission paths including a transmission path provided with the capacitor VMC and a transmission path provided with the resistor VMR3 may be formed between the monitor target node and the voltage monitoring device 5.

2.4.2 Effect

According to the modification, the monitor circuit 18 may include the attenuation prevention circuit 183 in addition to the buffer circuit 181 and the step-down circuit 182. In the attenuation prevention circuit 183, the resistor VMR3 and the capacitor VMC may be connected in parallel. Accordingly, when the voltage of the monitor target node includes a high frequency component, between the two parallel transmission paths, a ratio of a current flowing through the transmission path provided with the resistor VMR3 to a current flowing through the transmission path provided with the capacitor VMC may be reduced in the attenuation prevention circuit 183. Accordingly, for example, an increase in impedance of the resistor VMR3 caused by, for example, a circuit provided for connecting the monitor target node and the voltage monitoring device 5 can be prevented. Therefore, attenuation of the high frequency component of the voltage of the monitor target node due to the increase in the impedance can be prevented. Therefore, the reliability of the semiconductor storage device 1 can be further improved.

When the capacitor VMC is a variable capacitor, it is easy to adjust the monitor circuit 18 in accordance with a frequency band of the voltage of the monitor target node. Therefore, it is possible to monitor a voltage of a node in a wider frequency band compared with a case in which a constant capacitance capacitor is used. With such a configuration of the monitor circuit 18, the reliability of the semiconductor storage device 1 can also be further improved.

3 Others

In the first embodiment and the second embodiment, the voltage monitoring device 5 may be connected to the monitor circuit 18 of the semiconductor storage device 1 via the pad PVMON of the semiconductor storage device 1. However, the first embodiment and the second embodiment are not limited thereto. The voltage monitoring device 5 may be connected to the monitor circuit 18 via another pad instead of the pad PVMON. For example, the voltage monitoring device 5 may be connected to the monitor circuit 18 via a pad used for transmitting and receiving a signal/WP.

In the first embodiment and the second embodiment, the NAND flash memory as an example of the semiconductor device is described. However, the scope of the inventions are not limited thereto. The semiconductor device can be the other types of the semiconductor device, such as DRAM (Dynamic Randam Access Memory), SRAM (Static Randam Access Memory), MRAM (Magnetoresistive Random Access Memory), ReRAM (Resistive Random Access Memory), PCM (Phase Change Memory), Microcomputer, MPU (Micro Processing Unit), FPGA (Field-programmable gate array).

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
    a first pad to which a first external voltage as a reference voltage is applicable;
    a comparison circuit including a first input terminal connected to the first pad, a second input terminal to which a second voltage is applicable, and an output terminal configured to output a comparison result between the first external voltage and the second voltage; and
    a control circuit configured to output, external to the semiconductor device, a signal based on the comparison result.

2. The semiconductor device according to claim 1, wherein
    the control circuit is configured to output the signal based on a change in the first external voltage.

3. The semiconductor device according to claim 2, wherein
    the control circuit is configured to
        determine whether the second voltage is larger than the first external voltage,
        output, external to the semiconductor device, a first signal instructing to step up the first external voltage when it is determined that the second voltage is larger than the first external voltage, and
        output, external to the semiconductor device, a second signal instructing to end application of the first external voltage when it is determined that the second voltage is equal to or smaller than the first external voltage.

4. The semiconductor device according to claim 2, wherein
    the control circuit is configured to
        determine whether the second voltage is larger than the first external voltage,
        output, external to the storage device, a first signal instructing to end application of the first external voltage when it is determined that the second voltage is larger than the first external voltage, and
        output, external to the semiconductor device, a second signal instructing to step down the first external voltage when it is determined that the second voltage is equal to or smaller than the first external voltage.

5. The semiconductor device according to claim 1, wherein
    the comparison circuit comprises a first transistor connected to a first node, and
    the first input terminal of the comparison circuit is a gate of the first transistor.

6. The semiconductor device according to claim 5, wherein
    the comparison circuit comprises a second transistor connected to the first node, and
    the second input terminal of the comparison circuit is a gate of the second transistor.

7. The semiconductor device according to claim 1, further comprising:
    a switch having a first terminal connected to the second input terminal; and
    a first circuit connected to a second terminal of the switch, wherein
    the first circuit is configured to output the second voltage to the second terminal of the switch in response to a first command transmitted from the outside.

8. The semiconductor device according to claim 7, wherein
    the switch is configured to transfer the second voltage to the second input terminal in response to a second command transmitted from the outside.

9. The semiconductor device according to claim 7, wherein
    the switch comprises a transistor, and
    the second input terminal of the comparison circuit is a terminal of the transistor of the switch.

10. The semiconductor device according to claim 7, wherein the first command is a monitoring operation start command.

11. The semiconductor device according to claim 1, further including;
    a circuit including a plurality of transistors, formed on a substrate, and
    a memory cell array including a plurality of conductor layers, formed above the circuit.

12. The semiconductor device according to claim 11, wherein the conductor layers are word lines.

13. A semiconductor device comprising:
    a first pad;
    a buffer circuit including a first input terminal to which a first voltage is applicable, a second input terminal connected to the first pad, and an output terminal connected to the first pad;
    a switch having a first terminal connected to the first input terminal; and
    a first circuit connected to a second terminal of the switch, wherein
    the first circuit is configured to output the first voltage to the second terminal of the switch in response to a first command transmitted from an outside of the semiconductor device.

14. The semiconductor device according to claim 13, wherein
    the switch is configured to transfer the first voltage to the first input terminal in response to a second command transmitted from the outside.

15. The semiconductor device according to claim 13, further comprising:
    a second circuit provided between the buffer circuit and the first pad, wherein
    the second circuit includes
        a first resistor having a first terminal connected to the first pad and a second terminal commonly connected to the output terminal and the second input terminal of the buffer circuit, and
        a second resistor having a first terminal connected to the first terminal of the first resistor and a second terminal that is grounded.

16. The semiconductor device according to claim 15, further comprising:
a third resistor and a capacitor that are connected in parallel between the first pad and the first terminal of the first resistor.

17. The semiconductor device according to claim 16, wherein
the capacitor is a variable capacitor.

18. A semiconductor device comprising:
a first pad;
a buffer circuit including a first input terminal to which a first voltage is applicable, a second input terminal connected to the first pad, and an output terminal connected to the first pad;
a circuit including a plurality of transistors, formed on a substrate, and
a memory cell array including a plurality of conductor layers, formed above the circuit.

19. The semiconductor device according to claim 18, wherein the conductor layers are word lines.

* * * * *